United States Patent
Tanielian

(10) Patent No.: US 10,038,107 B2
(45) Date of Patent: Jul. 31, 2018

(54) ENHANCED PHOTO-THERMAL ENERGY CONVERSION

(71) Applicant: The Boeing Company, Chicago, IL (US)

(72) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 1375 days.

(21) Appl. No.: 13/785,619

(22) Filed: Mar. 5, 2013

(65) Prior Publication Data

US 2014/0252305 A1    Sep. 11, 2014

(51) Int. Cl.
| | | |
|---|---|---|
| C09K 5/00 | (2006.01) | |
| H01L 31/02 | (2006.01) | |
| F24J 2/06 | (2006.01) | |
| F24J 2/08 | (2006.01) | |
| F24J 2/46 | (2006.01) | |
| F24J 2/48 | (2006.01) | |
| B82Y 99/00 | (2011.01) | |

(52) U.S. Cl.
CPC .............. *H01L 31/02* (2013.01); *F24J 2/065* (2013.01); *F24J 2/08* (2013.01); *F24J 2/4649* (2013.01); *F24J 2/485* (2013.01); *B82Y 99/00* (2013.01); *Y02B 10/20* (2013.01); *Y02E 10/40* (2013.01); *Y10S 977/774* (2013.01)

(58) Field of Classification Search
CPC . H01L 31/02; H01L 31/0216; H01L 31/0272; H01L 31/035218; B82Y 15/00; B82Y 20/00; B82Y 99/00
USPC ..................................................... 252/71, 70
See application file for complete search history.

(56) References Cited

U.S. PATENT DOCUMENTS

| | | | |
|---|---|---|---|
| 7,190,870 B2* | 3/2007 | Sundar | B82Y 20/00 385/129 |
| 2007/0084460 A1 | 4/2007 | Beckman | |
| 2007/0158611 A1* | 7/2007 | Oldenburg | B22F 1/0025 252/71 |
| 2007/0249064 A1* | 10/2007 | De La Fuente | B82Y 15/00 436/518 |
| 2009/0105413 A1 | 4/2009 | Sun et al. | |
| 2009/0181478 A1* | 7/2009 | Cox | H01L 21/0271 438/22 |
| 2010/0243053 A1* | 9/2010 | Coe-Sullivan | B82Y 30/00 136/259 |

FOREIGN PATENT DOCUMENTS

| | | |
|---|---|---|
| EP | 2557373 A1 | 11/2011 |
| WO | 2012118956 A2 | 9/2012 |
| WO | 2013019330 A1 | 2/2013 |

OTHER PUBLICATIONS

Olk et al. "Subwavelength emitters in the near-infrared based on mercury telluride nanocrystals", Applied Physics Letters, vol. 84, No. 23, p. 4732; published Jun. 7, 2004.*

(Continued)

*Primary Examiner* — Jane L Stanley
(74) *Attorney, Agent, or Firm* — Miller, Matthias & Hull LLP

(57) ABSTRACT

Semiconducting quantum dots are applied to a fluid. The quantum dots are configured to absorb visible or near infrared light and re-radiate infrared energy that excites a fundamental vibration frequency of the fluid.

5 Claims, 2 Drawing Sheets

(56) References Cited

OTHER PUBLICATIONS

Keuleyan et al. "Synthesis of Colloidal HgTe Quantum Dots for Narrow Mid-IR Emission and Detection", J. Am. Chem. Soc., 2011, 133, 16422-16424; published Sep. 25, 2011.*
Keuleyan et al., "Synthesis of Colloidal HgTe Quantum Dots for Narrow Mid-IR Emissionand Detection," dx.doi.org/10.1021/ja2079509 | J. Am. Chem. Soc. 2011, 133, 16422-16424.
"Nanoparticles improve solar collection efficiency," http://phys.org/news/2011-04-nanoparticles-solar-efficiency.html (Apr. 5, 2011).
Bhattacharya et al., "Quantum Dot Infrared Detectors and Sources," International Journal of High Speed Electronics and Systems, vol. 12, No. 4, pp. 969-994 (2002).
Photonic Road SME, "R&D Report on Quantum Dots," http://www.photonicroad.eu/upload/PhotonicRoadSME_RD%20report%20on%20Quantum%20dots.pdf.
Neumann et al, "Solar Vapor Generation Enabled by Nanoparticles", http://www.pkusz.edu.cn/uploadfile/2012/1123/20121123091640908.pdf (2012).
"Colloidal Quantum Dot Solar Cells Break Conversion Efficiency Record," http://spectrum.ieee.org/nanoclast/semiconductors/nanotechnology/colloidal-quantum-dot-solar-cells-break-conversion-efficiency-record.
"Photothermal Energy Conversion in Nanofluids," http://sustainability.asu.edu/research/project/623/photothermal-energy-conversion-in-nanofluids.
"Nanoparticles Make Steam without Bringing Water to a Boil," http://www.technologyreview.com/news/507821/nanoparticles-make-steam-without-bringing-water-to-a-boil/.
Taylor et al., "Nanofluid optical property characterization: Towards efficient direct-absorption solar collectors", Nanoscale Research Letters, vol. 6, 225 (2011).
Taylor et al., "Applicability of nanofluids in high flux solar collectors", J. Renewable and Sustainable Energy, vol. 3, 023104 (2011).
Otanicar et al., , "Nanofluid-Based Direct Absorption Solar Collector" (2010).Mechanical Engineering Faculty Works. Paper 21. http://digitalcommons.Imu.edu/mech_fac/21.
Takehiko Shimanouchi; "Tables of Molecular Vibrational Frequencies Consolidated vol. I"; National Standard Reference Data System; 164 pages; Jun. 1972.

* cited by examiner

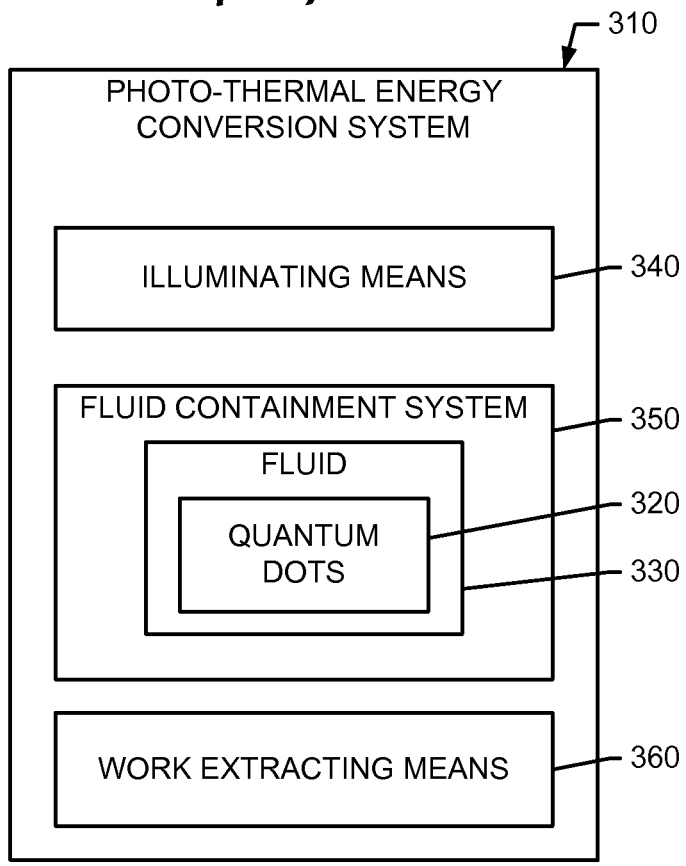
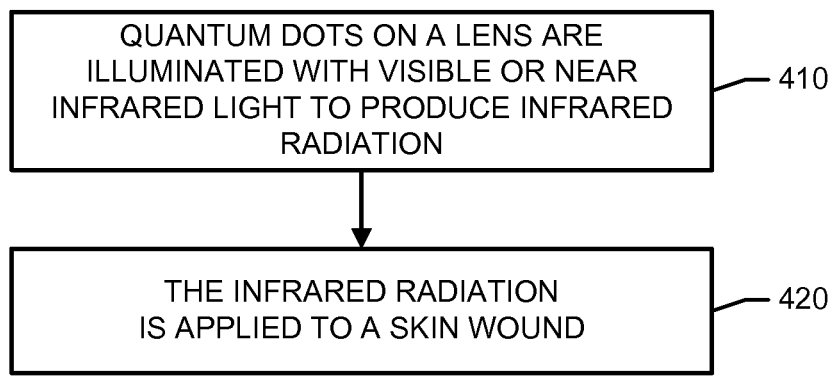

ENHANCED PHOTO-THERMAL ENERGY CONVERSION

BACKGROUND

Photo-thermal energy conversion systems that use water as a working fluid may employ a black surface that absorbs visible light. The absorbed light heats the black surface. When water is brought into direct or indirect contact with the black surface, the water is heated through convection and/or conduction. Mechanical work or another type of work may then be extracted from the heated water.

Conduction and convention are not the most efficient ways to heat water. They are beset by thermal interface issues and parasitic paths, which lower the transfer of energy from the black surface to the water.

Photo-thermal energy conversion efficiency may be increased by dispersing gold nanoparticles in the water. The gold nanoparticles support a plasmon resonance when illuminated by a certain frequency light. However, since gold nanoparticles are poor light emitters, typically emitting around 1% of absorbed radiation, they heat up and transfer heat to the surrounding water by conduction and/or convection.

Higher efficiency of photo-thermal energy conversion from visible light to water is desirable.

SUMMARY

According to an embodiment herein, a method comprises applying semiconducting quantum dots to a fluid. The quantum dots are configured to absorb visible or near infrared light and re-radiate infrared energy that excites a fundamental vibration frequency of the fluid.

According to another embodiment herein, a method comprises using quantum dots to downconvert visible or near infrared light to infrared energy, and using the infrared energy to heat a fluid.

According to another embodiment herein, a photo-thermal energy conversion energy system comprises a body of fluid and quantum dots suspended in the fluid. The quantum dots are configured to absorb visible or near infrared light and re-radiate infrared energy that excites a fundamental vibration frequency of the fluid. The system further comprises means for illuminating the quantum dots with visible or near infrared light.

According to another embodiment herein, a method comprises illuminating a lens covered with a layer of semiconducting quantum dots with visible or near infrared light. The quantum dots have a band gap for re-radiating infrared radiation. The method further comprises applying the infrared radiation to a skin wound, whereby re-radiated infrared energy cauterizes the wound.

These features and functions may be achieved independently in various embodiments or may be combined in other embodiments. Further details of the embodiments can be seen with reference to the following description and drawings.

BRIEF DESCRIPTION OF THE DRAWINGS

FIG. 3 is an illustration of a photo-thermal energy conversion system.

FIG. 4 is an illustration of a method of using semiconducting quantum dots to treat a skin wound.

DETAILED DESCRIPTION

Figure 1:
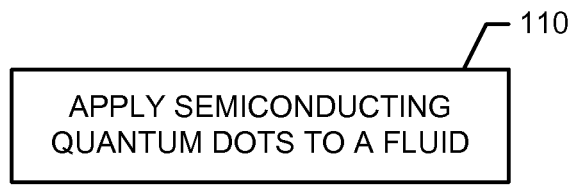
FIG. 1 is an illustration of a method that includes applying semiconducting quantum dots to a fluid.

Reference is made to FIG. 1, which illustrates a method of enhancing photo-thermal energy conversion. The method includes applying semiconducting quantum dots to a fluid (block 110). In general, quantum dots are semiconductors whose electronic characteristics are closely related to the size and shape of the individual crystal. Generally, the smaller the size of the crystal, the larger the band gap. Since semiconducting materials absorb wavelengths above their band gap, a quantum dot in general has a wide absorption spectrum with a narrow emission spectrum, which is determined by the band gap of the quantum dot.

The quantum dots applied to the fluid are configured to absorb visible or near infrared light and re-radiate infrared energy that excites a fundamental vibration frequency of the fluid. As the quantum dots absorb the light, they re-radiate infrared energy that causes the molecules in the fluid to vibrate and collide, thereby generating heat.

The semiconducting quantum dots are relatively efficient emitters (relative to gold nanoparticles), converting up to roughly 50% of absorbed light to infrared energy (the remaining absorbed light will cause the quantum dots to generate heat, which will further heat the fluid). In addition, the quantum dots advantageously introduce three-dimensional heating pathways to the fluid (as with gold nanoparticles) rather than performing surface heating (as with a black absorbing surface). Heating from within the fluid is more efficient than heating only at the surface.

In some embodiments, the fluid may be water, whereby the quantum dots are configured to absorb visible or near infrared light and re-radiate infrared energy that excites a fundamental vibration frequency of the water. The infrared energy may have a wavelength of about 3 microns, which corresponds to a fundamental vibration frequency (symmetric mode) where the two hydrogens and the oxygen oscillate against each other. The absorption coefficient of water is higher at 2.94 microns than at any other wavelength in the visible and infrared spectrum. There is a difference of $10^8$ in the absorption coefficient of water between the visible range and at 3400 $cm^{-1}$ (2.94 microns).

Quantum dots re-radiating energy at about a 3 micron wavelength may be produced from a material having an energy band gap at about 3 microns. One such material is mercury telluride (HgTe).

A method herein is not limited to water. The quantum dots may be applied to any fluid (gas, liquid or solid phase) that can be excited by a particular infrared frequency. For example, quantum dots may be configured to re-radiate infrared energy at a frequency where a particular organic molecule can be excited. Many organic molecules have vibration spectra in the infrared spectrum.

A method herein is not limited to a single fluid. The quantum dots may be applied to a mixture of fluids. The quantum dots re-radiate infrared energy that causes one of the fluids in the mixture to evaporate, but not the remainder of the mixture. Thus, the quantum dots may be applied to a selective heating of one of the fluids of the mixture.

The quantum dots may be applied in a variety of ways to a variety of objects. As a first example, quantum dots are suspended in the fluid. For instance, suspension may be colloidal, or the quantum dots may be configured to have the same density as the fluid.

A second example involves applying quantum dots to a lens. This example will be described in greater detail below.

Figure 2:
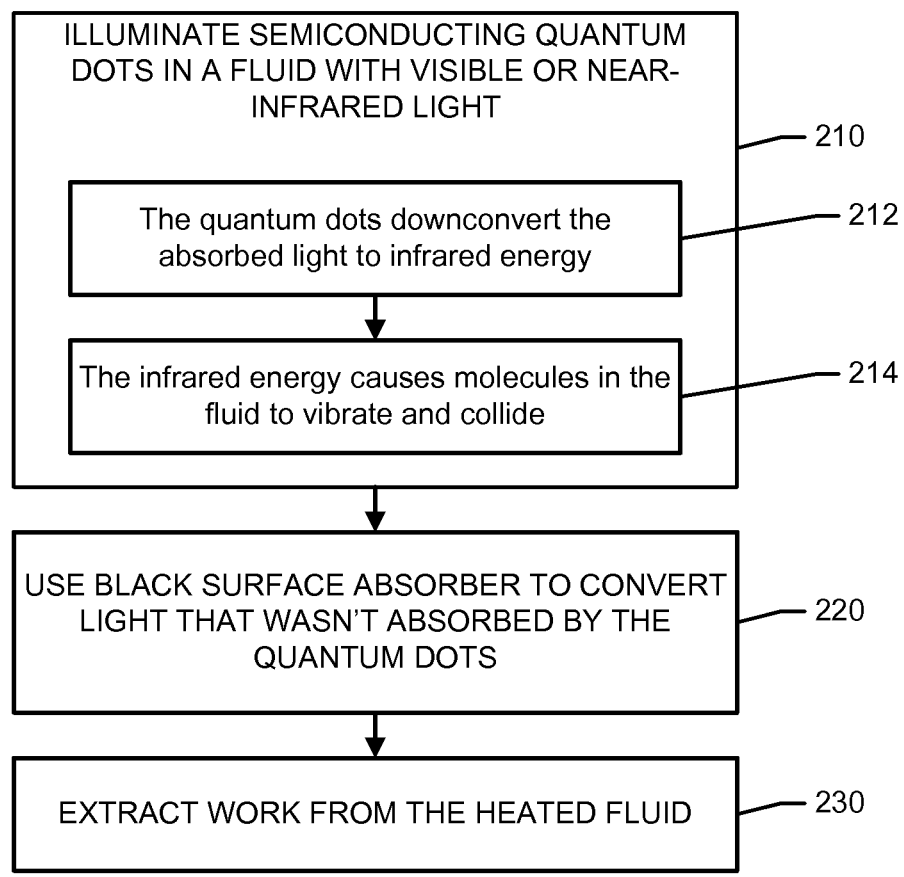
FIG. 2 is an illustration of a method of using quantum dots to heat a fluid.

Reference is now made to FIG. 2. During use, the quantum dots are illuminated with visible or near infrared light (block 210). The quantum dots downconvert the absorbed light to infrared energy (block 212), and the infrared energy causes molecules of the fluid to vibrate and collide (block 214), thereby generating heat.

In some embodiments, heating of the fluid may be further enhanced through the use of a black absorber surface (block 220). Light not absorbed by the quantum dots may pass through the fluid and be absorbed by the black absorber surface. The absorbed light causes the surface to generate additional heat, which is transferred to the fluid by conduction and/or convection.

Work may be extracted from the heated fluid (block 230). For instance, water may be heated to produce steam, which drives a turbine.

Reference is now made to FIG. 3, which illustrates a photo-thermal energy conversion system 310. The system 310 includes a body of working fluid 320 and quantum dots 330 suspended in the fluid 320. The quantum dots 330 are configured to absorb visible or near infrared light and re-radiate infrared energy that excites a fundamental vibration frequency of the working fluid 320.

The system 310 further includes a means 340 for illuminating the quantum dots 330 in the fluid 320. Examples of the illumination means 340 include, but are not limited to a flashlight, laser, or other visible or near infrared light source. If sunlight is used to illuminate the fluid 320, the means 340 does not include the Sun, but it may include optics for focusing the sunlight onto the quantum dots 330 in the fluid 320.

The system 310 further includes a containment system 350. In some embodiments, the containment system 350 may include a container for holding the fluid 320. In other embodiments, the containment system 350 may include a closed loop system for circulating the fluid 320. The closed loop system may be hermetically tight. To expose the quantum dots 330 to visible or near infrared light, a portion of the containment system 350 (e.g., fluid-carrying conduits) may be made of a material that is transparent to the light.

In some embodiments, one or more surfaces of the containment system 350 may be configured as a black absorber surface. For example, a container holding the fluid may have a bottom surface that functions as a black absorber surface.

The system 310 may further include a means 360 for extracting work from the heated fluid. Examples of the extracting means 360 include, but are not, limited to, mechanical components for creating electrical energy (e.g., a steam-driven turbine for power generation), components for using heated fluid to heat buildings, and components for using heated fluid to perform solar desalination.

The quantum dots 330 are not limited to being suspended in the working fluid 320. In some embodiments, one or more surfaces of the containment system 350 may be coated with quantum dots.

Quantum dots herein are not limited to surfaces of a containment system. For instance, a layer of quantum dots herein may be applied to a lens.

Reference is now made to FIG. 4, which illustrates a method of using a lens covered with a layer of quantum dots to treat a skin wound. The lens may be attached in front of a compact light source. The quantum dots are illuminated with visible or near infrared light to produce infrared radiation (block 410). The infrared radiation is applied to a skin wound for a few seconds (block 420). Infrared radiation having a wavelength of about 3 microns can heat up locally and kill any microorganisms that are present in the wound, and it can also cauterize the wound.

The invention claimed is:

1. A method of heating a fluid using quantum dots comprising:
    applying mercury telluride (HgTe) semiconducting quantum dots to the fluid, the fluid including water;
    illuminating the HgTe semiconducting quantum dots with visible or near infrared light to cause the HgTe semiconducting quantum dots to absorb the visible or near infrared light;
    allowing the HgTe semiconducting quantum dots to re-radiate infrared energy that corresponds to a fundamental vibration frequency of the fluid, the HgTe semiconducting quantum dots re-radiating infrared energy at a wavelength of about 3 microns; and
    using the infrared energy re-radiated by the HgTe semiconducting quantum dots to excite the fundamental vibration frequency of the fluid and heat the fluid.

2. The method of claim 1, wherein applying the HgTe semiconducting quantum dots includes adding the HgTe semiconducting quantum dots to the fluid such that the HgTe semiconducting quantum dots are suspended in the fluid.

3. The method of claim 1, wherein applying the HgTe semiconducting quantum dots to the fluid includes applying the HgTe semiconducting quantum dots to a containment system containing the fluid.

4. The method of claim 1, further comprising extracting work from the heated fluid.

5. A method of heating water using quantum dots comprising:
    applying mercury telluride (HgTe) semiconducting quantum dots to the water;
    illuminating the HgTe semiconducting quantum dots with visible or near infrared light to cause the HgTe semiconducting quantum dots to absorb the visible or near infrared light;
    allowing the HgTe semiconducting quantum dots to re-radiate infrared energy that corresponds to a fundamental vibration frequency of the water, the HgTe semiconducting quantum dots re-radiating infrared energy at a wavelength of about 3 microns;
    using the infrared energy re-radiated by the HgTe semiconducting quantum dots to excite the fundamental vibration frequency of the water and heat the water; and
    extracting work from the heated water.

* * * * *